US009869016B2

(12) United States Patent
Imran et al.

(10) Patent No.: US 9,869,016 B2
(45) Date of Patent: *Jan. 16, 2018

(54) COATED ARTICLE WITH LOW-E COATING HAVING MULTILAYER OVERCOAT AND METHOD OF MAKING SAME

(75) Inventors: Muhammad Imran, Brownstown, MI (US); Francis Wuillaume, Victor, NY (US); Brent Boyce, Novi, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 1128 days.

This patent is subject to a terminal disclaimer.

(21) Appl. No.: 13/401,988

(22) Filed: Feb. 22, 2012

(65) Prior Publication Data

US 2013/0216861 A1    Aug. 22, 2013

(51) Int. Cl.
 *B32B 15/04*    (2006.01)
 *B32B 17/06*    (2006.01)
 (Continued)

(52) U.S. Cl.
 CPC ............ *C23C 14/35* (2013.01); *C03C 17/366* (2013.01); *C03C 17/3626* (2013.01); *C03C 17/3644* (2013.01); *C03C 17/3652* (2013.01); *C23C 30/00* (2013.01); *C03C 2217/78* (2013.01); *Y10T 428/12597* (2015.01)

(58) Field of Classification Search
 CPC ........... B32B 9/00; B32B 15/00; B32B 15/04; B32B 17/00; B32B 17/06; B32B 2255/06; B32B 2255/205; B32B 2255/28; B32B 2255/00; C03C 15/00; C03C 17/00; C03C 17/06; C03C 17/23; C03C 17/3411; C03C 17/34; C03C 17/36; C03C 17/3602; C03C 17/3604; C03C 17/3607; C03C 17/361; C03C 17/3613; C03C 17/3615;
 (Continued)

(56) References Cited

U.S. PATENT DOCUMENTS 5,563,734 A    10/1996 Wolfe et al.
6,686,050 B2    2/2004 Lingle et al.
(Continued)

FOREIGN PATENT DOCUMENTS

EP    0 622 645    11/1994
WO    WO 2006/124503    11/2006
(Continued)

OTHER PUBLICATIONS

U.S. Appl. No. 13/401,948, filed Feb. 22, 2012; Imran et al.
U.S. Appl. No. 13/064,064, filed Mar. 3, 2011; Imran et al.
U.S. Appl. No. 13/064,062, filed Mar. 3, 2011; Imran et al.

*Primary Examiner* — Lauren R Colgan
(74) *Attorney, Agent, or Firm* — Nixon & Vanderhye P.C.

(57) ABSTRACT

A coated article is provided so as to include a low-E (low emissivity) coating having an infrared (IR) reflecting layer sandwiched between at least a pair of dielectric layers. The IR reflecting layer may be of or include a material such as silver (Ag), and is provided between a pair of contact layers. The low-E coating includes an overcoat having a substantially metallic layer (e.g., NbZr or Zr) which has been found to improve the durability of the coating without significantly sacrificing desired optical characteristics. Such coated articles may be used in the context of windows.

18 Claims, 3 Drawing Sheets

(51) Int. Cl.
    *C23C 14/35*    (2006.01)
    *C23C 30/00*    (2006.01)
    *C03C 17/36*    (2006.01)

(58) Field of Classification Search
    CPC ............ C03C 17/3639; C03C 17/3642; C03C 17/3657; C03C 17/366; C03C 17/3681
    USPC ................ 428/432, 688, 689, 699, 701, 702
    See application file for complete search history.

(56) References Cited

U.S. PATENT DOCUMENTS

| | | |
|---|---|---|
| 6,749,941 B2 | 6/2004 | Lingle |
| 6,852,419 B2 | 2/2005 | Stachowiak |
| 6,863,928 B2 | 3/2005 | Stachowiak |
| 6,890,659 B2 | 5/2005 | Stachowiak |
| 6,908,679 B2 | 6/2005 | Stachowiak et al. |
| 6,967,060 B2 | 11/2005 | Stachowiak |
| 6,974,630 B1 | 12/2005 | Stachowiak |
| 7,147,924 B2 | 12/2006 | Stachowiak |
| 7,153,578 B2 | 12/2006 | Chonlamaitri et al. |
| 7,166,359 B2 | 1/2007 | Kriltz et al. |
| 7,390,572 B2 | 6/2008 | Butz et al. |
| 7,462,398 B2 | 12/2008 | Lemmer et al. |
| 7,534,496 B2 | 5/2009 | Lemmer et al. |
| 7,592,068 B2 | 9/2009 | Disteldorf et al. |
| 7,597,962 B2 | 10/2009 | Butz et al. |
| 7,597,963 B2 | 10/2009 | Corsner et al. |
| 7,655,313 B2 | 2/2010 | Blacker et al. |
| 7,771,830 B2 | 8/2010 | Neuman et al. |
| 7,858,191 B2 | 12/2010 | Lemmer et al. |
| 7,879,448 B2 | 2/2011 | Dietrich et al. |
| 7,897,260 B2 | 3/2011 | Nunez-Regueiro et al. |
| 7,998,320 B2 | 8/2011 | Laird et al. |
| 8,017,243 B2 | 9/2011 | Blacker et al. |
| 2004/0224167 A1* | 11/2004 | Stachowiak ................. 428/432 |
| 2005/0069717 A1 | 3/2005 | Stachowiak |
| 2005/0123772 A1* | 6/2005 | Coustet et al. ............. 428/432 |
| 2006/0159933 A1 | 7/2006 | Disteldorf et al. |
| 2007/0281171 A1* | 12/2007 | Coster et al. ............... 428/432 |
| 2008/0011408 A1* | 1/2008 | Maschwitz .................... 156/99 |
| 2008/0038148 A1 | 2/2008 | Crook |
| 2008/0311389 A1* | 12/2008 | Roquiny et al. ............ 428/336 |
| 2009/0004043 A1 | 1/2009 | Tawancy |
| 2009/0324967 A1 | 12/2009 | Disteldorf et al. |
| 2010/0062245 A1* | 3/2010 | Martin et al. ................ 428/336 |
| 2010/0221575 A1 | 9/2010 | Stull |
| 2011/0261442 A1* | 10/2011 | Knoll et al. .................. 359/360 |
| 2011/0262726 A1 | 10/2011 | Knoll et al. |

FOREIGN PATENT DOCUMENTS

| | | |
|---|---|---|
| WO | WO 2009/157970 | 12/2009 |
| WO | WO 2012/118469 | 9/2012 |

* cited by examiner

COATED ARTICLE WITH LOW-E COATING HAVING MULTILAYER OVERCOAT AND METHOD OF MAKING SAME

This invention relates to coated articles that include a low-E (low emissivity) coating and a multilayer overcoat including at least one substantially metallic layer. In certain example embodiments the low-E coating may include at least one infrared (IR) reflecting layer of a material such as silver, and the substantially metallic layer of the overcoat may be of or include niobium zirconium (NbZr) and/or zirconium (Zr). Such coated articles may be used in the context of monolithic windows, insulating glass (IG) window units, laminated windows, and/or other suitable applications.

BACKGROUND AND SUMMARY OF THE INVENTION

Coated articles having low-E coatings are known in the art. For example, see the following U.S. Patent Documents which describe low-E coatings and which are all incorporated herein by reference in their entireties: U.S. Pat. Nos. 6,686,050, 6,749,941, 6,863,928, 7,166,359, 7,390,572, 7,462,398, 7,534,496, 7,597,962, 7,597,963, 7,655,313, 7,771,830, 7,858,191, 7,879,448, 7,897,260, 7,998,320, and 8,017,243. A low-E coating is for the purpose of providing efficient solar control in applications such as windows, and includes at least one IR reflecting layer sandwiched between two contact layers. The contact layers which sandwich an IR reflecting layer therebetween are sometimes referred to as barrier layers. The contact layer directly below and contacting an IR reflecting layer is often of a material such as ZnO, NiCr, or $NiCrO_x$, and the contact layer directly over and contacting an IR reflecting layer is often of a material such as NiCr or $NiCrO_x$. The contact/barrier layer provided directly over and contacting an IR reflecting layer is for protecting the IR reflecting layer from aggressive environments during sputtering of overlying layers as well as during the lifetime of the coating, and for providing adhesion between the IR reflecting layer and an overlying dielectric layer. However, in order to meet typically desired transmission and optical requirements of low-E coatings, the contact layer provided over an IR reflecting layer generally needs to be very thin. Thin upper contact/barrier layers can often provide sufficient durability when the coating is used in the interior of an insulating glass (IG) window unit where the coating is not directly exposed to the environment. However, for monolithic applications where the coating is directly exposed to the environment (either directly exposed to the interior of a building or home, or directly exposed to the exterior atmosphere), a thin upper contact/barrier layer is sometimes not sufficient by itself to protect the IR reflecting layer (e.g., silver layer) against environmental attacks.

Thus, while conventional low-E coatings provide efficient solar control and are overall good coatings, they are sometimes lacking in terms of one or more of: (a) corrosion resistance to acid and/or alkaline solutions (e.g., 80% HCl boil test and/or 20% NaOH boil test); (b) mechanical performance such as scratch resistance; and/or (c) durability. Accordingly, there exists a need in the art for a coated article that includes a low-E coating and which has improved durability characteristics, but which still is capable of acceptable thermal performance (e.g., blocking a reasonable amount of IR radiation) and/or heat treatment (HT). It is a purpose of this invention to fulfill at least one of the above-listed needs, and/or other needs which will become apparent to the skilled artisan once given the following disclosure.

In certain example embodiments of this invention, an improved overcoat is provided for a low-E coating in order to improve its overall durability. In certain example embodiments the low-E coating may include at least one infrared (IR) reflecting layer of a material such as silver, and the overcoat for protecting the low-E coating includes a substantially metallic layer. In certain example embodiments, the substantially metallic layer of the overcoat may be of niobium zirconium (NbZr) or zirconium (Zr). In certain example embodiments, the substantially metallic layer (e.g., NbZr or Zr) of the overcoat is sandwiched between respective underlying and overlying dielectric layers (e.g., of or including silicon nitride). Thus, in certain example embodiments the substantially metallic layer (e.g., NbZr or Zr) of the overcoat is not in contact with any metallic IR reflecting layer (e.g., is not in contact with any Ag or Au layer). In certain example embodiments, the overcoat may further include an overlying dielectric layer of or including zirconium oxide (e.g., $ZrO_2$) which may be the uppermost layer of the coating relative to the underlying substrate that supports the coating. It has surprisingly been found that such an overcoat improves the durability of the coating in terms of protection of the IR reflecting layer(s) from chemicals, scratches, scratch corrosion, fingerprint corrosion, environmental damage and mechanical damage. Such coated articles may be used in the context of monolithic windows, insulating glass (IG) window units, laminated windows, and/or other suitable applications.

The coated article may or may not be heat treated (e.g., thermally tempered) in different embodiments of this invention. The heat treatment (HT) may be for at least about 5 minutes at a temperature(s) of at least about 580 degrees C., so as to be sufficient for thermal tempering or the like.

In certain example embodiments of this invention, when the substantially metallic layer of the overcoat is of or includes NbZr, the Zr/Nb ratio (atomic %) in the NbZr based layer may be from about 0.001 to 1.0, more preferably from about 0.001 to 0.60, more preferably from about 0.004 to 0.50, and even more preferably from about 0.05 to 0.2, with an example Zr/Nb ratio being about 0.1. In certain example embodiments, NbZr based layer of the overcoat may include from about 0.1 to 60% Zr, more preferably from about 0.1 to 40% Zr, even more preferably from 1 to 20% Zr, still more preferably from 2 to 15% Zr, more preferably from about 5 to 15% Zr, and most preferably from 8 to 12% Zr (atomic %). These Zr ranges apply to both metallic and slightly oxidized and/or nitrided NbZr based layers.

In certain example embodiments of this invention, there is provided a coated article including a layer system supported by a glass substrate, the layer system comprising: a first dielectric layer on the glass substrate; an infrared (IR) reflecting layer comprising silver on the glass substrate over at least the first dielectric layer; a contact layer on the glass substrate over and directly contacting the IR reflecting layer; a second dielectric layer on the glass substrate over at least the contact layer; a layer comprising niobium zirconium on the glass substrate over and directly contacting the second dielectric layer; a third dielectric layer on the glass substrate over and directly contacting the layer comprising niobium zirconium; and a layer comprising zirconium oxide on the glass substrate over at least the third dielectric layer.

In certain example embodiments of this invention, there is provided a coated article including a layer system supported by a glass substrate, the layer system comprising: a first dielectric layer on the glass substrate; an IR reflecting layer comprising silver on the glass substrate over at least the first dielectric layer; a contact layer on the glass substrate over and directly contacting the IR reflecting layer; a second dielectric layer on the glass substrate over at least the contact layer; a substantially metallic layer comprising zirconium on the glass substrate over and directly contacting the second dielectric layer; and a third dielectric layer on the glass substrate over and directly contacting the substantially metallic layer comprising zirconium.

In certain example embodiments of this invention, there is provided a coated article including a layer system supported by a substrate, the layer system comprising: a first dielectric layer on the substrate; an IR reflecting layer comprising silver on the substrate over at least the first dielectric layer; a contact layer on the substrate over and directly contacting the IR reflecting layer; a second dielectric layer on the substrate over at least the contact layer; a substantially metallic layer comprising niobium zirconium or NiCrMo on the substrate over and directly contacting the second dielectric layer; and a third dielectric layer on the substrate over and directly contacting the substantially metallic layer.

IN THE DRAWINGS

DETAILED DESCRIPTION OF CERTAIN EXAMPLE EMBODIMENTS OF THE INVENTION

Figure 1:
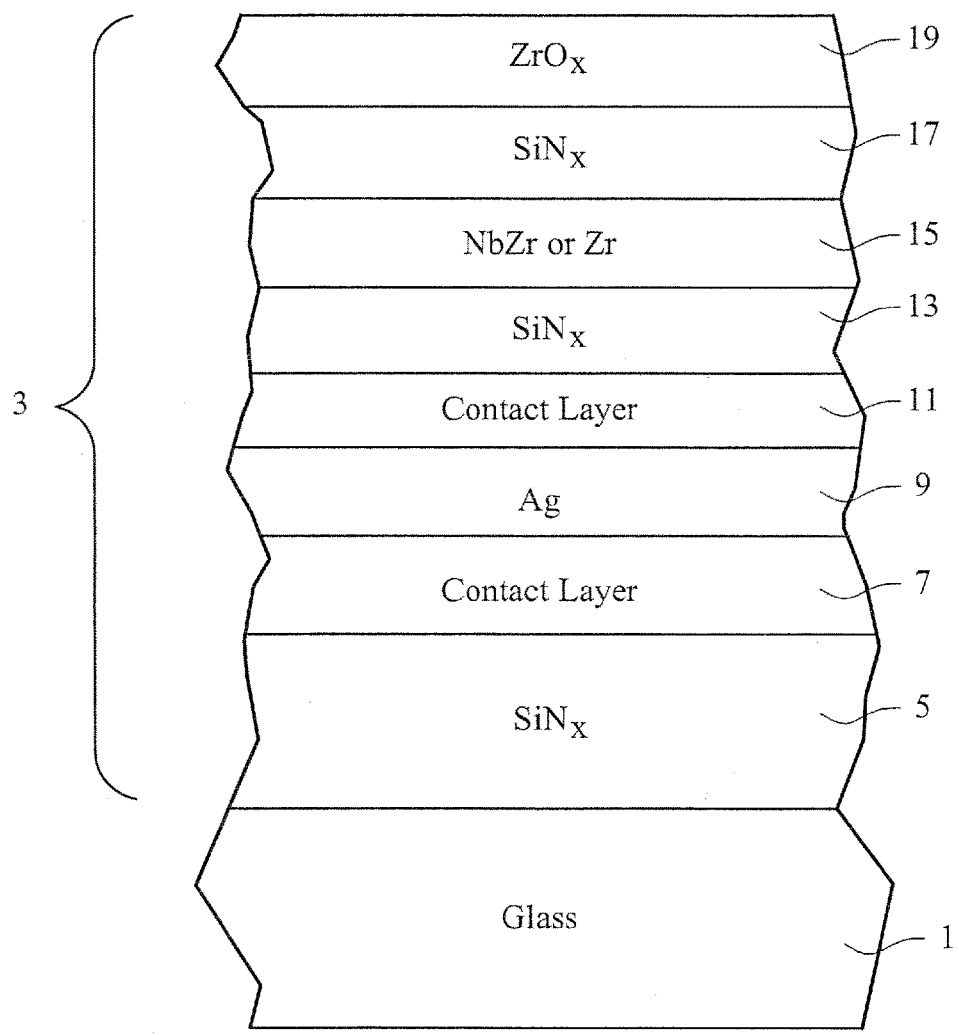
FIG. 1 is a partial cross sectional view of an embodiment of a monolithic coated article (heat treated or not heat treated) according to an example embodiment of this invention.

Referring now more particularly to the accompanying drawings in which like reference numerals indicate like parts throughout the several views.

Certain embodiments of this invention provide coated articles that may be used in windows such as monolithic windows (e.g., vehicle, residential, and/or architectural windows), IG window units, laminated windows, skylights, transparent freezer doors, and/or other suitable applications.

A multilayer overcoat is provided for a low-E coating in order to improve its overall durability. In certain example embodiments the low-E coating may include at least one infrared (IR) reflecting layer 9 of a material such as silver, and the overcoat for protecting the IR reflecting layer(s) includes a substantially metallic layer 15. In certain example embodiments, the substantially metallic layer 15 of the multilayer overcoat may be of niobium zirconium (NbZr) or zirconium (Zr). In certain example embodiments, the substantially metallic layer 15 of the overcoat is sandwiched between respective underlying and overlying dielectric layers 13 and 17 respectively. Thus, in certain example embodiments the substantially metallic layer 15 of the overcoat is not in contact with any metallic IR reflecting layer (e.g., is not in contact with any Ag or Au layer). In certain example embodiments, the overcoat may further include an overlying dielectric layer of or including zirconium oxide (e.g., $ZrO_2$) 19 which may be the uppermost layer of the coating 3 relative to the underlying substrate 1 that supports the coating. It has surprisingly been found that such a multilayer overcoat improves the durability of the coating in terms of protection of the IR reflecting layer(s) from chemicals, scratches, scratch corrosion, fingerprint corrosion, environmental damage and mechanical damage. Such coated articles may be used in the context of monolithic windows, insulating glass (IG) window units, laminated windows, and/or other suitable applications. The multilayer overcoat, including substantially metallic layer 15, is able to provide improved durability for the coating while at the same time not significantly sacrificing desired optical characteristics. For example, along with improved durability, the coated article is able to achieve desired visible transmission, desired optical characteristics such as color, good IR reflectance/blocking, and good color stability upon heat treatment (HT) in certain example embodiments of this invention.

Coated articles according to preferred embodiments of this invention have a visible transmission, before and/or after optional HT, of at least about 30%, more preferably of at least about 40%, with example visible transmission ranges being from about 40-60%, more preferably from about 45-55%. Coated articles according to preferred embodiments of this invention have a sheet resistance ($R_s$), before and/or after optional HT, of less than about 30 ohms/square, more preferably less than about 20 ohms/square, and most preferably less than about 15 ohms/square. For example, coated articles according to certain example embodiments of this invention may have a sheet resistance of about 10-13 ohms/square when coated, which will drop to about 8-10 ohms/square if the coated article is thermally tempered.

FIG. 1 illustrates a coated article according to an example embodiment of this invention. The coated article in FIG. 1 includes glass substrate 1 (e.g., clear, green, bronze, or blue-green glass substrate from about 1.0 to 10.0 mm thick, more preferably from about 1.0 mm to 6.0 mm thick), and a multi-layer coating 3 (or layer system) provided on the substrate 1 either directly or indirectly. As shown in FIG. 1, the coating 3 includes dielectric layer 5, lower contact layer 7 (e.g., of or including Ni, Cr, NiCr and/or $NiCrO_x$), IR reflecting layer 9 of or including silver, gold, or the like, upper contact/barrier layer 11 (e.g., of or including Ni, Cr, NiCr and/or $NiCrO_x$), dielectric layer 13 (e.g., of or including silicon nitride), substantially metallic barrier layer 15 (e.g., of or including NbZr and/or Zr), dielectric layer 17 (e.g., of or including silicon nitride), and top dielectric layer 19 (e.g., of or zirconium oxide). The overcoat may be said to be made up of layers 15, 17 and 19, or alternatively may be said to be made up of layers 13, 15, 17 and 19 in different example instances. Silicon nitride layers discussed herein (e.g., see layers 5, 13, 17) may be doped (e.g., from about 0.1 to 12%) with aluminum and/or oxygen in certain example embodiments of this invention, and zirconium oxide layers discussed herein (e.g., see layer 19) may also be doped (e.g., from about 0.1 to 12%) with aluminum in certain example embodiments of this invention. The layer 19 of or including an oxide of Zr may also include at least one of Ti, Al and Mo in certain example embodiments. Other layers and/or materials may also be provided in certain example embodiments of this invention, and it is also possible that certain layers may be removed or split in certain example instances.

Overall coating 3 includes at least layers 5-19. It is noted that the terms "oxide" and "nitride" as used herein include various stoichiometries. For example, the term silicon nitride includes stoichiometric $Si_3N_4$, as well as non-stoichiometric silicon nitride such as Si-rich type silicon nitride. Layers 5-19 may be deposited on substrate 1 via magnetron sputtering, any other type of sputtering, or via any other suitable technique in different embodiments of this invention.

Infrared (IR) reflecting layer 9 is preferably substantially or entirely metallic and/or conductive, and may comprise or consist essentially of silver (Ag), gold, or any other suitable IR reflecting material. IR reflecting layer 9 helps allow the coating to have low-E and/or good solar control characteristics such as low emittance, low sheet resistance; and so forth. The TR reflecting layer 9 may, however, he slightly oxidized in certain embodiments of this invention. In the FIG. 1 embodiment, the coating includes only one IR reflecting layer 9 of or including Ag and/or Au, but in alternative embodiments multiple such IR reflecting layers 9 may be provided as in other low-E coatings. In certain example embodiments, in IR reflecting layer(s) 9 Ag may be alloyed with Pd, Cu, or both Pd and Cu, with approximately 0.5-2% (by weight or atomic %) of each of Pd and Cu. Other potential alloys for layer(s) 9 include Ag and one or more of Co, C, Mg, Ta, W, NiMg, PdGa, CoW, Si, Ge, Au, Pt, Ru, Sn, Al, Mn, V, In, Zn, Ir, Rh, and/or Mo. In general, dopant concentrations (of the materials in addition to Ag) may be in the range of 0.2-5% (by weight or atomic %), more preferably between 0.2-2.5%. Operating within these ranges may help the silver maintain the desirable optical characteristics of the Ag-based layer 9 that otherwise might be lost by virtue of the alloying, thereby helping to maintain the overall optical characteristics of the stack while also enhancing chemical, corrosion, and/or mechanical durability. As with the other layers discussed herein, the silver based IR reflecting layer 9 may be sputter-deposited on the substrate 1.

The upper and lower contact layers 7 and 11 may be of or include Ni, Cr, NiCr and/or $NiCrO_x$ in certain example embodiments of this invention. Thus, the contact layers 7 and 11 may be metallic or substantially metallic in preferred embodiments, and may be oxided in certain instances. In certain example embodiments, upper and lower contact layers 7, 11 may be of or include nickel (Ni), chromium/chrome (Cr), a nickel alloy such as nickel chrome (NiCr), Haynes alloy, a Ni-inclusive ternary alloy such as NiCrMo, an oxide of any of these, or other suitable material(s). For example, one of these layers (e.g., layer 7) may be of or include zinc oxide instead of NiCr. The use of, for example, NiCr in these layers is for durability in certain example instances, and the provided thicknesses permit low $\Delta E^*$ values to be achieved upon HT. Contact layers 7 and 11 (e.g., of or including Ni and/or Cr) may or may not be continuous in different embodiments of this invention across the entire IR reflecting layer.

In certain example embodiments, one or both of the NiCr layers 7, 11 includes from about 70-81% Ni, from about 15-19% Cr, from about 3-6% Al, and possibly from about 0-4% (or 1-4%) Fe, and may be oxided in certain example instances so that the metallic portion of the layer is characterized by these percentages. An example is 76.5% Ni, 17% Cr, 4.3% Al, and optionally about 2.2% Fe, for one or both of layers 7, 11.

In certain example embodiments, one or both of contact layers 7, 11 is of or includes a Ni-inclusive ternary alloy. In other example embodiments, the Ni-inclusive ternary alloy may further include Ti, Cr, Nb, Zr, Mo, W, Co and/or combinations thereof. The Ni-inclusive ternary allow of layer 7 and/or 11 may be of or include $Ni_xCr_yMo_z$, $Ni_xTi_yCr_z$, $Ni_xTi_yNb_z$, $Ni_xNb_yZr_z$, $Ni_xCr_yZr_z$, $Ni_xTi_yMo_z$, $Ni_xZr_yMo_z$, $Ni_xNb_yMo_z$, $Ni_xCr_yMo_z$, $Ni_xW_yCr_z$, $Ni_xW_yMo_z$, $Ni_xW_yZr_z$, $Ni_xW_yNb_z$, $Ni_xW_yTi_z$, $Ni_xCo_yMo_z$, $Ni_xCo_yCr_z$, $Ni_xCo_yMo_z$, $Ni_xCo_yZr_z$, $Ni_xCo_yNb_z$, and/or $Ni_xCo_yTi_z$. In certain instances, the Ni-inclusive ternary alloy barrier layer 7 and/or 11 (e.g., comprising materials such as nickel, chromium, and/or molybdenum, etc.) has (1) good adhesion to the IR reflecting layer; (2) good corrosion resistance to acidic and/or alkaline solutions; (3) protection during optional high temperature oxidation; and (4) good overall chemical and/or mechanical durability. In certain example embodiments, one or both of contact layers 7, 11 comprises Cr and Mo, and more particularly may be of or include 54-58 wt. % Ni, 20-22.5 wt. % Cr, and 12.5-14.5 wt. % Mo, and may be oxided in certain example instances so that the metallic portion of the layer is characterized by these percentages. In certain example embodiments, one or both of contact layers 7, 11 is of or includes a Ni-inclusive alloy of NiCr, NiTi, and/or NiCrMo, and the layers 7 and 11 may be of the same or different materials. In certain example embodiments, one or both of contact layers 7, 11 may be of or include 60-65 wt. % Ni, 12-17 wt. % Cr, and 20-25 wt. % Mo, and may be oxided in certain example instances so that the metallic portion of the layer is characterized by these percentages. In certain example embodiments of this invention, one or both contact layers 7, 11 may be of or include 63-67 wt. % Ni, 1-2 wt. % Cr, and 25-30 wt. % Mo, and may be oxided in certain example instances so that the metallic portion of the layer is characterized by these percentages.

It has advantageously been found that NiCrMo-based alloys (e.g. C22, BC1, and/or B3 Hallestoy), for use in contact layer(s) 7 and/or 11, may protect a coating including at least one silver-based layer 9 better than layers consisting essentially of NiCr in some cases. Furthermore, NiCrMo-based alloys may protect the coated article from visible damage in certain intances. It is further believed that NiCrMo of layer 11 may form an alloy with the overlying dielectric layer 13 in the coating, which may improve the performance of this layer against alkaline solutions and boiling water. This may be particularly true in embodiments where the dielectric layer 13 is silicon based.

Tables 1-3 below show the compositions of three example embodiments of NiCrMo-based alloys (e.g., C22, BC1, and B3) for use in one or both of contact layers 7, 11. Thus, one or both of contact layers 7, 11 may be of or include the following materials in Tables 1-3, may be metallic or substantially metallic, and may be oxided in certain example instances so that the metallic portion of the layer 7 and/or 11 is characterized by the percentages in Table 1, Table 2, or Table 3.

TABLE 1

| $Ni_xCr_yMo_z$ (e.g., C22) - elemental composition by wt. % | | | |
|---|---|---|---|
| Element | Preferred | More Preferred | Example |
| Ni | 40-70% | 50-60% | 54-58% (e.g., 56%) |
| Cr | 5-40% | 10-30% | 20-22.5% |
| Mo | 5-30% | 10-20% | 12.5-14.5% |
| Fe | 0-15% | 0-10% | 1-5% (e.g., 3%) |
| W | 0-15% | 0-10% | 1-5% (e.g., 3%) |
| Co | 0-15% | 0-10% | 1-5% (e.g., 3%) |
| Si | 0-2% | 0-1% | =<0.2% (e.g., .08%) |
| Mn | 0-3% | 0-2% | =<1% (e.g., 0.5%) |
| C | 0-1% | 0-0.5% | =<0.1% (e.g., .01%) |
| V | 0-2% | 0-1% | =<1% (e.g., 0.35%) |

TABLE 2

Ni$_x$Cr$_y$Mo$_z$ (e.g., B3) - elemental composition by wt. %

| Element | Preferred | More Preferred | Example |
|---|---|---|---|
| Ni | 50-80% | 60-70% | 63-67% (e.g., 65%) |
| Cr | 0-15% | 0-5% | 1-2% (e.g., 1.5%) |
| Mo | 10-50% | 20-40% | 25-30% (e.g., 28.5%) |
| Fe | 0-10% | 0-5% | 1-4% (e.g., 3%) |
| W | 0-15% | 0-10% | 1-5% (e.g., 3%) |
| Co | 0-15% | 0-10% | 1-5% (e.g., 3%) |
| Si | 0-2% | 0-1% | =<0.2% (e.g., .1%) |
| Mn | 0-15% | 0-10% | 1-5% (e.g., 3%) |
| C | 0-1% | 0-0.5% | =<0.1% (e.g., .01%) |
| Al | 0-3% | 0-2% | =<1% (e.g., 0.5%) |
| Ti | 0-2% | 0-1% | =<0.5% (e.g., .2%) |

TABLE 3

Ni$_x$Cr$_y$Mo$_z$ (e.g., BC1) - elemental composition by wt. %

| Element | Preferred | More Preferred | Example |
|---|---|---|---|
| Ni | 50-80% | 60-70% | 60-65% (e.g., 62%) |
| Cr | 5-30% | 10-20% | 12-17% (e.g., 15%) |
| Mo | 10-40% | 15-25% | 20-25% (e.g., 22%) |
| Fe | 0-10% | 0-5% | 1-3% (e.g., 2%) |
| Si | 0-2% | 0-1% | =<0.2% (e.g., .08%) |
| Mn | 0-5% | 0-2% | =<0.5% (e.g., 0.25%) |
| C | 0-1% | 0-0.5% | =<0.1% (e.g., 0.01%) |
| Al | 0-3% | 0-2% | =<1% (e.g., 0.5%) |

Dielectric layers 5, 13 and 17 may be of or include silicon nitride (e.g., $Si_3N_4$) or any other suitable material in certain example embodiments of this invention such as silicon oxynitride. These layers are provided for durability purposes, and to protect the underlying layers, and/or for antireflective purposes. Silicon nitride based layer 13 provides for good adhesion between the underlying IR reflecting portion of the coating and the overlying metallic or substantially metallic layer 15 of the protective overcoat. In certain example embodiments, silicon nitride layer 17 may be nitrogen-rich (i.e., contains more nitrogen than $Si_3N_4$), which has been found to improve optical characteristics. In contrast, silicon nitride layer 5 may be silicon-rich (i.e., contains more Si than $Si_3N_4$), which has been found to improve durability. In certain example embodiments of this invention, silicon nitride based layer 17 is substantially thicker (e.g., at least about 40 angstroms thicker, more preferably at least 75 angstroms thicker, and most preferably at least about 100 angstroms thicker) than silicon nitride based layer 13, in order to provide lower SHGC, improved durability, and good aesthetics. In certain example embodiments, layers 5, 13 and 17 each may have an index of refraction (n) of from about 1.9 to 2.2, more preferably from about 1.95 to 2.05. Silicon nitride layers 5, 13 and/or 17 may be doped with aluminum (e.g., from about 1-15% Al, more preferably from about 1-12%, or 1-5% Al) in certain instances, and may be slightly oxided in certain example embodiments of this invention. It will be appreciated that in alternative embodiments of this invention, material other than silicon nitride may be used for one or more of layers 5, 13, and/or 17. For example, FIG. 2 emphasizes that material other than silicon nitride may be used for one or more of dielectric layers 5, 13, and/or 17 in certain example embodiments of this invention.

It has been found that the use of Zr, and in particular NbZr, in or for protective barrier layer 15 allows the resulting coated article which has a low-E coating to realize excellent chemical and mechanical durability, and also good thermal performance if desired. For example, the use of NbZr in protective layer 15 allows the resulting coated article(s) to achieve improved corrosion resistance to alkaline solutions such as NaOH (compared to layer stacks where the multilayer overcoat including layer 15 is not present), good thermal performance, improved mechanical performance such as scratch resistance (compared to layer stacks where the multilayer overcoat including layer 15 is not present). In certain example embodiments of this invention, NbZr or Zr based layer 15 may be from about 10-100 angstroms thick, more preferably from about 10-50 angstroms thick, and most preferably from about 10-30 angstroms thick. An example thickness for layer 15 is about 2 nm (about 20 angstroms). Protective layer 15 is thick enough to provide the improvement in durability, but is thin enough to not adversely affect the optical performance of the coated article. For example, if layer 15 is too thick, the visible transmission of the coated article could undesirably drop and/or the desired coloration of the coated article could no longer be realized. This is why the layer 15 is most preferably from about 10-30 angstroms thick.

When the metallic (or substantially metallic) layer 15 of the overcoat is of or includes NbZr (which may be slightly oxided and/or nitrided in certain example embodiments), the Zr/Nb ratio (atomic %) in the NbZr based layer may be from about 0.001 to 1.0, more preferably from about 0.001 to 0.60, more preferably from about 0.004 to 0.50, and even more preferably from about 0.05 to 0.2, with an example Zr/Nb ratio being about 0.1. In certain example embodiments, NbZr based layer 15 may include from about 0.1 to 60% Zr, more preferably from about 0.1 to 40% Zr, even more preferably from 1 to 20% Zr, still more preferably from 2 to 15% Zr, more preferably from about 5 to 15% Zr, and most preferably from 8 to 12% Zr (atomic %). For example, layer 15 may be sputter-deposited using a sputtering target containing 90% Nb and 10% Zr in certain example embodiments. These Zr ranges apply to both metallic and slightly oxided and/or nitrided NbZr based layers 15. NbZr or Zr layer 15 preferably contains no more than about 20% oxygen, more preferably no more than about 15% oxygen, and most preferably no more than about 10% or 5% oxygen. NbZr or Zr layer 15 may be slightly oxided (sub-oxided) in certain example embodiments of this invention, for example including from about 1-20% oxygen, more preferably from about 1-10% or 1-5% oxygen. It has been surprisingly found that slightly oxiding layer 15 as originally sputter-deposited is beneficial in that it allows for thermal stability of the coated article upon HT (e.g., thermal tempering) to be improved. In this respect, in certain example embodiments of this invention, when heat treated (e.g., thermally tempered), the coated article is able to realize a $\Delta E^*$ value (glass side reflective and/or transmissive) of no more than about 4.0, more preferably no more than about 3.0, evidencing the thermal stability (see the technique for calculating $\Delta E^*$ that is set forth in U.S. Patent Document 2009/0324967, which is hereby incorporated herein by reference).

Protective barrier layer 15 may alternatively be of or include NiCrMo, e.g., in the amounts and formulations discussed above in connection with the contact layers. In such alternative embodiments, the layer 15 is still metallic or substantially metallic in preferred embodiments of the invention.

It has been found that layer 19 of or including zirconium oxide improves durability and can improve thermal stability if the coated article is heat treated. In certain example embodiments, the use of a zirconium oxide inclusive uppermost layer 19 in combination with the silicon nitride inclusive layer 17 and protective layer 15 can result in a coated article which has excellent durability and can be significantly heat treated (e.g., thermally tempered) without suffering from significant mottling damage or other damage from heat treatment (e.g., the coated article can realize acceptable visible transmission, a* and/or b* values following heat treatment such as thermal tempering). In certain example embodiments, the index "n" of the zirconium oxide layer 19 is from about 2.1 to 2.25, more preferably about 2.16 (at 550 nm).

Without layers 15, 17 and 19, testing (e.g., 20% NaOH testing and 80% HCl testing, Taber test with CASS Rating at 26d) has shown that the coating (underlying layers 5, 7, 9, 11, 13) is destroyed due to poor durability. However, when layers 15, 17 and 19 are added to these same underlying layers, the durability remarkably improves and the coating survives these same tests.

Figure 2:
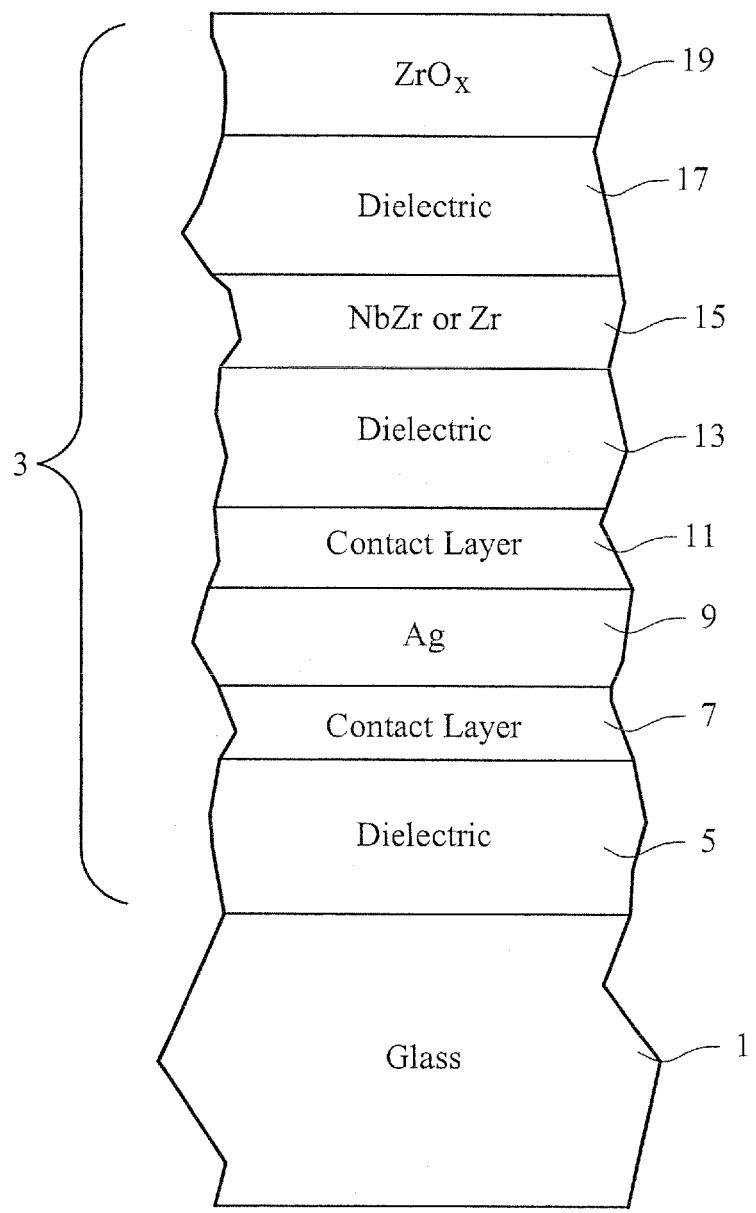
FIG. 2 is a partial cross sectional view of an embodiment of a monolithic coated article (heat treated or not heat treated) according to an example embodiment of this invention.

While FIG. 1 illustrates the coating 3 in a manner where protective layer 15 is in direct contact with dielectric layers 13 and 17, and where layer 9 is the only Ag-based IR reflecting layer in the coating, the instant invention is not so limited. Other layer(s) may be provided between layers 13 and 15 (and/or between layers 15 and 17, and/or between layers 17 and 19) in certain other embodiments of this invention. Moreover, other layer(s) (not shown) may be provided between substrate 1 and layer 5 in certain embodiments of this invention. Thus, while the coating 3 or layers thereof is/are "on" or "supported by" substrate 1 (directly or indirectly), other layer(s) may be provided therebetween. Thus, for example, the layer system 3 and layers thereof shown in FIGS. 1-2 are considered "on" the substrate 1 even when other layer(s) (not shown) are provided therebetween (i.e., the terms "on" and "supported by" as used herein are not limited to directly contacting). Also, more than one Ag-based IR reflecting layer may be provided in alternative embodiments of this invention.

Moreover, in different embodiments of this invention, layers 15, 17 and 19 as described herein and shown in FIGS. 1-2 may be provided over any of the various low-E coatings in U.S. Pat. Nos. 6,686,050, 6,749,941, 6,863,928, 7,166,359, 7,390,572, 7,462,398, 7,534,496, 7,597,962, 7,597,963, 7,655,313, 7,771,830, 7,858,191, 7,879,448, 7,897,260, 7,998,320, and/or 8,017,243, all of which are incorporated herein by reference. The precise stack of the low-E coating under the overcoat is not particularly limiting in certain example embodiments of this invention.

Figure 3:
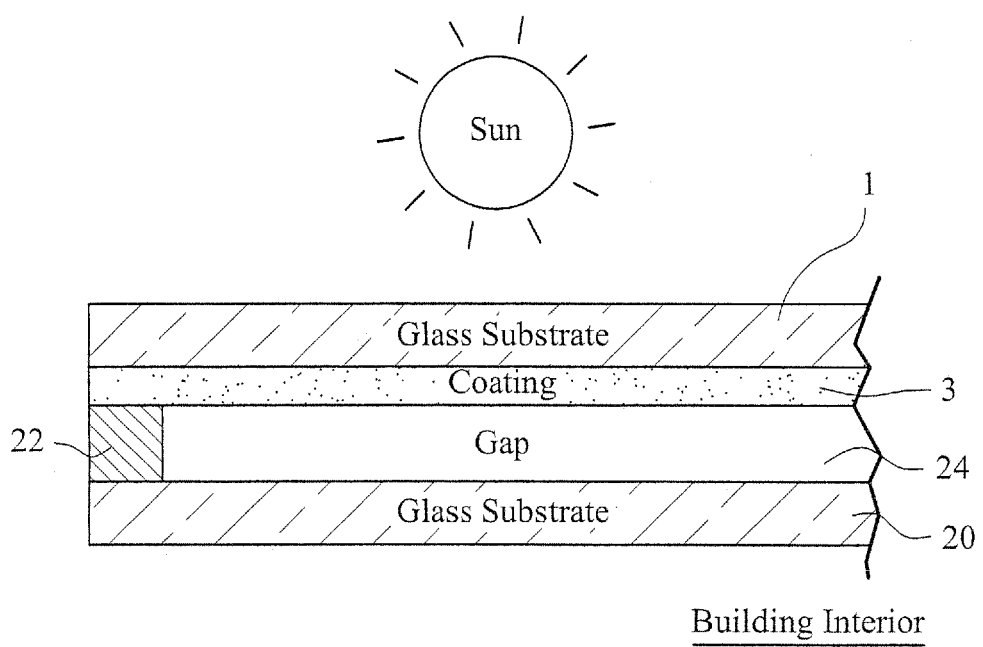
FIG. 3 is a partial cross sectional view of an IG window unit including the coating of FIG. 1 and/or FIG. 2 according to an example embodiment of this invention.

While FIGS. 1-2 illustrate a coated article according to an embodiment of this invention in monolithic form, coated articles according to other embodiments of this invention may comprise IG (insulating glass) window units as shown in FIG. 3. FIG. 3 illustrates an IG window unit including the coated article of FIG. 1 and/or FIG. 2. As shown in FIG. 3, the coated substrate 1 may be coupled to (after HT in certain instances) another glass substrate 20 via at least one spacer and/or seal 22 so as to form an IG window unit. The space or gap 24 between the substrates may or may not be evacuated to a pressure below atmospheric in different example embodiments. Moreover, the space or gap 24 may or may not be filled with a gas (e.g., Ar) in different embodiments of this invention. In IG embodiments, coating 3 from FIG. 1 and/or FIG. 2 may be provided on the inner wall of the outer substrate 1 of the IG unit as shown in FIG. 3, and/or on either major surface of the inner substrate 20, or in any other suitable location in other embodiments of this invention. The coating 3 may be located in similar locations in laminated window applications.

Turning back to FIGS. 1-2, various thicknesses may be used consistent with this invention. According to certain non-limiting example embodiments of this invention, example thicknesses and materials for the respective layers on the glass substrate 1 are as follows in Table 4. Before and/or after heat treatment (HT) such as thermal tempering, in certain example embodiments of this invention coated articles have color characteristics below in Table 5 (monolithic). It is noted that in Table 5 subscript "G" stands for glass side reflective color, subscript "T" stands for transmissive color, and subscript "F" stands for film side color. As is known in the art, glass side (G) means reflective color when viewed from the glass side (as opposed to the layer/film side) of the coated article. Film side (F) means reflective color when viewed from the side of the coated article on which the coating 3 is provided.

TABLE 4

(Example non-limiting thicknesses)

| Layer | Example Range (nm) | Preferred (nm) | Best (nm) |
|---|---|---|---|
| silicon nitride (layer 5): | 5-90 nm | 30-60 nm | 45 nm |
| lower contact (layer 7): | 1-5 nm | 1-3 nm | 2 nm |
| silver (layer 9): | 3-15 nm | 4-8 nm | 6 nm |
| upper contact (layer 11): | 1-5 nm | 1-3 nm | 2 nm |
| silicon nitride (layer 13): | 5-70 nm | 20-40 nm | 30 nm |
| NbZr, Zr, or C22 (layer 15): | 1-10 nm | 1-3 nm | 2 nm |
| silicon nitride (layer 17): | 5-100 nm | 30-60 nm | 45 nm |
| zirconium oxide (layer 19): | 2-12 nm | 3-8 nm | 4 or 5 nm |

TABLE 5

Example Color/Optical Characteristics (Monolithic)

| | General | Preferred | Most Preferred |
|---|---|---|---|
| $T_{vis}$ (TY): | >=30% | 40-60% | 45-55% |
| $L^*_T$ | 68-84 | 73-79 | 74-78 |
| $a^*_T$ | +4 to −7 | 0 to −5 | −1 to −3 |
| $b^*_T$ | −10 to +12 | −3 to +8 | 0 to +5 |
| $R_G Y$ (glass side): | 16-29% | 18-25% | 20-23% |
| $L^*_G$ | 46-63 | 50-58 | 53-55 |
| $a^*_G$ | −6 to +5 | −4 to +1 | −2 to 0 |
| $b^*_G$ | −10 to +20 | 0 to +10 | +2 to +4 |
| $R_F Y$ (film side): | 6-20% | 6-12% | 7-9% |
| $L^*_F$ | 27-40 | 29-38 | 31-35 |
| $a^*_F$ | −5 to +10 | −1 to +6 | 0 to +4 |
| $b^*_F$ | +10 to −50 | −10 to −40 | −20 to −30 |

Color characteristics are measured and reported herein using the CIE LAB a*, b* coordinates and scale (i.e. the CIE a*b* diagram, Ill. CIE-C, 2 degree observer). The terms "emittance" and "transmittance" are well understood in the art and are used herein according to their well known meaning. Thus, for example, the terms visible light transmittance (TY), infrared radiation transmittance, and ultraviolet radiation transmittance ($T_{uv}$) are known in the art. Total solar energy transmittance (TS) is then usually characterized as a weighted average of these values from 300 to 2500 nm (UV, visible and near IR). With respect to these transmittances, visible transmittance (TY), as reported herein, is characterized by the standard CIE Illuminant C, 2 degree observer, technique at 380-720 nm; near-infrared is 720-2500 nm; ultraviolet is 300-380 nm; and total solar is 300-2500 nm. For purposes of emittance, however, a particular infrared range (i.e. 2,500-40,000 nm) is employed.

Visible transmittance can be measured using known, conventional techniques. For example, by using a spectrophotometer, such as a Perkin Elmer Lambda 900 or Hitachi U4001, a spectral curve of transmission is obtained, Visible transmission is then calculated using the aforesaid ASTM 308/2244-93 methodology. A lesser number of wavelength points may be employed than prescribed, if desired. Another technique for measuring visible transmittance is to employ a spectrometer such as a commercially available Spectrogard spectrophotometer manufactured by Pacific Scientific Corporation. This device measures and reports visible transmittance directly. As reported and measured herein, visible transmittance (i.e. the Y value in the CIE tristimulus system, ASTM E-308-85) uses the Ill. C., 2 degree observer.

Another term employed herein is "sheet resistance". Sheet resistance ($R_s$) is a well known term in the art and is used herein in accordance with its well known meaning. It is here reported in ohms per square units. Generally speaking, this term refers to the resistance in ohms for any square of a layer system on a glass substrate to an electric current passed through the layer system. Sheet resistance is an indication of how well the layer or layer system is reflecting infrared energy, and is thus often used along with emittance as a measure of this characteristic. "Sheet resistance" may for example be conveniently measured by using a 4-point probe ohmmeter, such as a dispensable 4-point resistivity probe with a Magnetron Instruments Corp. head, Model M-800 produced by Signatone Corp. of Santa Clara, Calif.

The terms "heat treatment" and "heat treating" (HT) as used herein mean heating the article to a temperature sufficient to enabling thermal tempering, bending, and/or heat strengthening of the glass inclusive article. This definition includes, for example, heating a coated article to a temperature of at least about 580 or 600 degrees C. for a sufficient period to enable tempering and/or heat strengthening. In some instances, the HT may be for at least about 4 or 5 minutes.

In certain embodiments of this invention, there is provided a coated article including a layer system supported by a glass substrate, the layer system comprising: a first dielectric layer on the glass substrate; an IR reflecting layer comprising silver on the glass substrate over at least the first dielectric layer; a contact layer on the glass substrate over and directly contacting the IR reflecting layer; a second dielectric layer on the glass substrate over at least the contact layer; a layer comprising niobium zirconium on the glass substrate over and directly contacting the second dielectric layer; a third dielectric layer on the glass substrate over and directly contacting the layer comprising niobium zirconium; and a layer comprising zirconium oxide on the glass substrate over at least the third dielectric layer.

In the coated article of the preceding paragraph, the first dielectric layer can comprise silicon nitride.

In the coated article of any of the preceding two paragraphs, the second dielectric layer can comprise silicon nitride.

In the coated article of any of the preceding three paragraphs, the third dielectric layer can comprise silicon nitride.

In the coated article of any of the preceding four paragraphs, each of the first and second dielectric layers can comprise silicon nitride.

In the coated article of any of the preceding five paragraphs, the coated article can further include a contact layer under and directly contacting the IR reflecting layer.

In the coated article of any of the preceding six paragraphs, the layer comprising niobium zirconium can be substantially metallic.

In the coated article of any of the preceding seven paragraphs, the layer comprising niobium zirconium can be metallic.

In the coated article of any of the preceding eight paragraphs, the coated article can have a visible transmission of from about 40 to 60%.

In the coated article of any of the preceding nine paragraphs, the coated article can be a window.

In the coated article of any of the preceding ten paragraphs, the layer system can have a sheet resistance ($R_s$) of less than about 20 ohms/square.

In the coated article of any of the preceding eleven paragraphs, the layer system can contain only one silver-based or gold-based IR reflecting layer.

In the coated article of any of the preceding twelve paragraphs, the layer comprising niobium zirconium can be oxided.

In the coated article of any of the preceding thirteen paragraphs, in the layer comprising niobium zirconium the ratio of zirconium to niobium (Zr/Nb) can be from about 0.001 to 0.60, more preferably from about 0.004 to 0.50.

In the coated article of any of the preceding fourteen paragraphs, the layer comprising niobium zirconium can consist essentially of niobium zirconium.

In the coated article of any of the preceding fifteen paragraphs, the layer comprising niobium zirconium can comprise from about 1 to 20% Zr, more preferably from about 2 to 15% Zr (atomic %).

In the coated article of any of the preceding sixteen paragraphs, the coated article may comprises an IG window unit, a monolithic window, or a laminated window.

In the coated article of any of the preceding seventeen paragraphs, the layer comprising niobium zirconium need not contact any IR reflecting layer comprising Ag or Au.

In the coated article of any of the preceding eighteen paragraphs, the coated article can be heat treated.

In the coated article of any of the preceding nineteen paragraphs, the contact layer can comprise one or more of: (a) NiCr, (b) Ni and Mo, and/or (c) Ni, Cr and Mo.

In certain embodiments of this invention, there is provided a coated article including a layer system supported by a glass substrate, the layer system comprising: a first dielectric layer on the glass substrate; an IR reflecting layer comprising silver on the glass substrate over at least the first dielectric layer; a contact layer on the glass substrate over and directly contacting the IR reflecting layer; a second dielectric layer on the glass substrate over at least the contact layer; a substantially metallic layer comprising zirconium or NiCrMo on the glass substrate over and directly contacting the second dielectric layer; and a third dielectric layer on the glass substrate over and directly contacting the substantially metallic layer.

In the coated article of the immediately preceding paragraph, the coated article can further include a dielectric layer comprising zirconium oxide on the glass substrate over at least the third dielectric layer.

In the coated article of any of the preceding two paragraphs, the second dielectric layer can comprise silicon nitride.

In the coated article of any of the preceding three paragraphs, the third dielectric layer can comprise silicon nitride.

In the coated article of any of the preceding four paragraphs, each of the first and second dielectric layers, and/or the second and third dielectric layers, can comprise silicon nitride.

In the coated article of any of the preceding five paragraphs, the substantially metallic layer can consist essentially of Zr or NbZr.

In the coated article of any of the preceding six paragraphs, the substantially metallic layer can be metallic.

In the coated article of any of the preceding seven paragraphs, the coated article can have a visible transmission of from about 40 to 60%.

In the coated article of any of the preceding eight paragraphs, the layer system may contain only one silver-based or Au-based IR reflecting layer.

In the coated article of any of the preceding nine paragraphs, the substantially metallic layer contains no more than about 20% oxygen.

In the coated article of any of the preceding ten paragraphs, the coated article can comprise an IG window unit, a monolithic window, or a laminated window.

In the coated article of any of the preceding eleven paragraphs, the substantially metallic layer need not contact any IR reflecting layer comprising Ag or Au.

In the coated article of any of the preceding twelve paragraphs, the contact layer can be of or include one or more of: (a) NiCr, (b) Ni and Mo, and/or (c) Ni, Cr and Mo.

Once given the above disclosure many other features, modifications and improvements will become apparent to the skilled artisan. Such other features, modifications and improvements are therefore considered to be a part of this invention, the scope of which is to be determined by the following claims.

What is claimed is:

1. A coated article including a coating having a layer system supported by a glass substrate, the layer system comprising:
    a first dielectric layer on the glass substrate;
    an IR reflecting layer comprising silver on the glass substrate over at least the first dielectric layer;
    a contact layer on the glass substrate over and directly contacting the IR reflecting layer;
    a second dielectric layer comprising silicon nitride on the glass substrate over at least the contact layer;
    a layer comprising niobium zirconium on the glass substrate over and directly contacting the second dielectric layer comprising silicon nitride, wherein the layer comprising niobium zirconium comprises from about 2 to 15% Zr (atomic %);
    a third dielectric layer comprising silicon nitride on the glass substrate over and directly contacting the layer comprising niobium zirconium;
    a layer comprising zirconium oxide on the glass substrate over and directly contacting the third dielectric layer comprising silicon nitride, so that the layer comprising niobium zirconium is located between and directly contacting said second dielectric layer comprising silicon nitride and said third dielectric layer comprising silicon nitride;
    wherein the layer comprising niobium zirconium is from 1-3 nm thick;
    wherein the layer comprising zirconium oxide is from 3-8 nm thick;
    wherein the layer comprising niobium zirconium is substantially thinner than each of the second and third dielectric layers comprising silicon nitride and is also substantially thinner than the IR reflecting layer comprising silver;
    wherein the layer comprising zirconium oxide is substantially thinner than each of the second and third dielectric layers comprising silicon nitride; and
    wherein the coating contains only one silver-based IR reflecting layer.

2. The coated article of claim 1, wherein the first dielectric layer comprises silicon nitride.

3. The coated article of claim 1, further comprising a contact layer under and directly contacting the IR reflecting layer.

4. The coated article of claim 1, wherein the layer comprising niobium zirconium is substantially metallic.

5. The coated article of claim 1, wherein the layer comprising niobium zirconium is metallic.

6. The coated article of claim 1, wherein the coated article has a visible transmission of from about 40 to 60%.

7. The coated article of claim 1, wherein the coated article is a window.

8. The coated article of claim 1, wherein the layer system has a sheet resistance ($R_s$) of less than about 20 ohms/square.

9. The coated article of claim 1, wherein the layer comprising niobium zirconium is oxidized.

10. The coated article of claim 1, wherein in the layer comprising niobium zirconium the ratio of zirconium to niobium (Zr/Nb) is from about 0.001 to 0.60.

11. The coated article of claim 1, wherein in the layer comprising niobium zirconium the ratio of zirconium to niobium (Zr/Nb) is from about 0.004 to 0.50.

12. The coated article of claim 1, wherein the layer comprising niobium zirconium consists essentially of niobium zirconium.

13. The coated article of claim 1, wherein the coated article comprises an IG window unit, a monolithic window, or a laminated window.

14. The coated article of claim 1, wherein the layer comprising niobium zirconium does not contact any IR reflecting layer comprising Ag or Au.

15. The coated article of claim 1, wherein the coated article is heat treated.

16. The coated article of claim 1, wherein the contact layer comprises NiCr.

17. The coated article of claim 1, wherein the contact layer comprises Ni and Mo.

18. The coated article of claim 1, wherein the contact layer comprises Ni, Cr and Mo.

* * * * *